United States Patent [19]

Sumnitsch

[11] Patent Number: 5,762,391
[45] Date of Patent: Jun. 9, 1998

[54] GRIPPER FOR DISK-SHAPED ARTICLES

[75] Inventor: Franz Sumnitsch, Klagenfurt, Austria

[73] Assignee: Sez Semiconductor-Equipment Zubehor Fur Die Halbleiterfertigung Gesellschaft m.b.H., Villach, Austria

[21] Appl. No.: 632,457

[22] PCT Filed: Oct. 20, 1994

[86] PCT No.: PCT/AT94/00153

§ 371 Date: Apr. 19, 1996

§ 102(e) Date: Apr. 19, 1996

[87] PCT Pub. No.: WO95/11518

PCT Pub. Date: Apr. 27, 1995

[30] Foreign Application Priority Data

Oct. 22, 1993 [AT] Austria ................ A 2144/93

[51] Int. Cl.⁶ ........................................ B25J 15/10
[52] U.S. Cl. ............... 294/119.1; 294/83; 414/941
[58] Field of Search .............. 294/34, 88, 99.1, 294/100, 94, 116, 119.1; 901/37, 39; 414/941; 269/34, 107, 153, 234

[56] References Cited

U.S. PATENT DOCUMENTS

| | | | |
|---|---|---|---|
| 3,170,322 | 2/1965 | Cavanaugh | 294/119.1 |
| 3,715,048 | 2/1973 | Raab | |
| 4,227,851 | 10/1980 | Beezer | |
| 4,453,757 | 6/1984 | Soraoka | |
| 4,676,541 | 6/1987 | Lord et al. | 294/119.1 |
| 4,705,313 | 11/1987 | Radice | 294/119.1 |
| 4,707,013 | 11/1987 | Vranish et al. | 294/119.1 |
| 4,861,086 | 8/1989 | Toral | 294/119.1 |
| 5,125,708 | 6/1992 | Borcea et al. | 294/119.1 |
| 5,520,501 | 5/1996 | Kouno et al. | 294/119.1 |

FOREIGN PATENT DOCUMENTS

| | | |
|---|---|---|
| 0 396 951 | 11/1990 | European Pat. Off. . |
| 0 482 406 | 4/1992 | European Pat. Off. . |
| 0 498 439 | 8/1992 | European Pat. Off. . |
| 2 317 679 | 10/1974 | Germany . |
| 22 09 691 | 6/1979 | Germany . |
| 25 56 595 | 9/1980 | Germany . |
| 3322142 | 12/1984 | Germany ............ 294/119.1 |
| 39 15 038 | 11/1990 | Germany . |
| 9204457 U | 7/1992 | Germany . |

OTHER PUBLICATIONS

Nicholls, "Centering Mechanism for Robot Disk Holder", *IBM Technical Disclosure Bulletin*, vol. 27, No. 7B, Dec., 1984, p. 4472.

Primary Examiner—Dean Kramer
Attorney, Agent, or Firm—Young & Thompson

[57] ABSTRACT

A gripper assembly with gripper fingers (2) which are mounted so that they can be guided and moved radially inward and outward relative to the main body of the assembly. The gripper fingers (2) are biased radially inward by springs. Fitted in the main body (1) is a finger-opening device (20) with a conical body (21) which moves all of the fingers (2) radially outward together against the action of the springs. If the finger-opening device (20) is then retracted, at least some of the fingers (2) come to rest against the edge of the disc-shaped article. If the device (20) is retracted further, the remaining fingers also come to rest, under the action of their associated springs, against the edge of the disc-shaped article. The conical body (21) in the finger-opening device (20) acts on the fingers (2) via guiding elements (12) fitted inside the main body and connected to the fingers (2) by guiding rods (8).

13 Claims, 3 Drawing Sheets

GRIPPER FOR DISK-SHAPED ARTICLES

BACKGROUND OF THE INVENTION

1. Field of the Invention

The invention relates to a gripper for disk-shaped articles with at least a roughly circular outside periphery, with a base body, with gripping claws which are guided to move radially to the inside and to the outside relative to the base body, and which are intended to abut the outside periphery of the disk-shaped article, with elastic means which load the gripping claws radially to the inside, and with spreading means in order to move the gripping claws to the outside against the action of the elastic means, the gripping claws being attached to mountings which are attached to guide rods which are guided to move in guide sleeves which are inserted in the base body. A gripper of this type is known from U.S. Pat. No. 4,453,757.

2. Description of the Related Art

In practice, there often arises the problem of grasping disk-shaped articles such that neither the top nor the bottom of the disk-shaped article is touched, that therefore the disk-shaped article is grasped and held only on its outside periphery (outer edge). This problem arises for example in the handling of silicon wafers, with surfaces which may not be touched when the wafer is held by a gripper.

In the gripper known from DE-A-3 915 038 there are holding arms which act on the edge of a disk-shaped article and which can be adjusted using hydraulic motors along paths of motion which are at an angle to one another. In this case the holding arms are to be moved toward or away from one another by piston-cylinder units. In the piston-cylinder units there are coil compression springs which act on the cylinders and which are designed to press them back into their initial position (position of the gripping fingers drawn near to one another).

In U.S. Pat. No. 4,453,757 the spreading means is a part which can twist in a base body and which is raised and lowered relative to the base body during twisting as a result of the grooves which are provided in its outer periphery and which interact with guide rollers located in the base body. To actuate the gripping claws there are other grooves which have a changing depth so that when the cylindrical part is turned opposite to the base body the gripping claws can be adjusted radially to the base body.

This combination of two movements which are aligned perpendicularly to one another (radial adjustment and raising and lowering) is of great importance for the grippers of U.S. Pat. No. 4,453,757, since in this way the gripping claws are to be prevented from rubbing against the bottom of the wafer when it is grasped.

A device for spreading elastic rings is known from DE-U-92 04 457.3. In this device, by means of the conical spreading means mountings for spreading fingers can be adjusted radially to the outside against the force of the springs in order to spread an elastic ring. To place the elastic ring spread in this way on another part there are additional fingers which strip the ring from the spreading fingers.

From IBM Technical Disclosure Bulletin Vol 27, No. 7B (December 1984) a mounting for disk-shaped articles is known which has three gripping elements. Each gripping element carries a grooved roller, the disk-shaped article, when it is held by the mounting, fitting with its edge into the grooves of the rollers.

U.S. Pat. No. 04 227 851 shows a manipulator with swivelling gripping claws. In this manipulator known from U.S. Pat. No. 4,227,851 the gripping claws which are swivel-mounted in a tubular carrier are loaded by a tension spring. To actuate the gripping claws, within the tubular body there is a floating piston which acts on the sloped surfaces of the gripper to spread then when the pressure medium is applied.

SUMMARY OF THE INVENTION

The object of the invention is to devise a gripper of the initially mentioned type in which the aforementioned problems are solved and which has a simple and reliable structure.

This object is achieved according to the invention with a gripper which is characterized by the fact that guide bodies which are guided in guide grooves provided in the base body and which are assigned to the spreading means are attached to the inner ends of the guide rods, that the spreading means has a conical spreading body which can move in the base body perpendicularly to the direction of movement of the gripping claws and which interacts with the guide bodies, and that the elastic means which load the gripping claws are coil compression springs which are placed over the guide rods and which with their one end abut the inner end of one guide sleeve and with their other end abut the surface of a guide body which points to the outside.

In the gripper according to the invention the gripping claws are moved to the outside by actuating the spreading means so that the gripping claws are located in a readiness position next to the outside periphery of the disk-shaped article to be grasped. Thereupon the action of the spreading means is neutralized so that the gripping claws move radially to the inside and abut the outside periphery of the disk-shaped article since they are moved radially to the inside by the spring means. If the disk-shaped article is one with a not exactly circular outside periphery, as is the case for example in the aforementioned wafers, as the action of the spreading means continues to be neutralized the gripping claws which do not yet adjoin the outside edge under the action of the spring means are likewise applied to the outside periphery of the wafer so that it is reliably held all around.

Since the gripping claws are attached to mountings which are guided to move via guide rods in guide sleeves which are inserted in the base body there is exact guidance of the claws. The components of the gripper and its base body can be optimized with respect to the functions to be performed by them.

A simple construction for simultaneous spreading of the gripping claws (moving the latter radially to the outside with respect to the base body) arises because the spreading means has a conical spreading body which can move in the base body perpendicularly to the direction of movement of the gripping claws and which interacts with the radially inner ends of the guide rods or the guide bodies.

In the invention it is preferred if the parts of the guide rods, the parts located outside of the base body, are accommodated in protective bellows.

In one preferred embodiment it is provided that the gripping claws have pins which on their free ends have a radially projecting flange and that the flange has an upper boundary surface which rises at a slant from the outside to the inside. The radially projecting flange with its wedge-shaped cross section causes the claws with their flange to be pushed under the outside periphery of the article and thus to grasp a disk-shaped article which lies flat on a base.

The disk-shaped article is securely held on the gripper according to the invention if above the flange there is a projecting ring on the pin. Here it is preferred that the ring be bounded by two conical surfaces. In this embodiment the article is also reliably held perpendicularly to its plane even if the force of the spring means is not so large. The danger that the article (wafer) will be damaged under the action of the gripping claws is thus precluded.

To minimize the friction forces of the gripper according to the invention it can be provided that the conical jacket surface of the spreading body rests on rollers which are supported to turn freely on the radially inner ends of the guide rods or the guide bodies.

The maximum spread position according to the design of the gripper according to the invention can be easily defined such that the end position of the spreading body which corresponds to the gripping claws adjusted maximally to the outside is determined by its front tapered end abutting the base body.

To actuate the spreading body of the spreading means various drive motors such as actuating magnets and the like can be provided. In one preferred embodiment of the invention however it is provided that the spreading body is actuated by a hydraulic motor which is integrated in the base body. The hydraulic motor is preferably a pneumatic cylinder.

The invention also extends to the spreading body being actuated by a hydraulic motor integrated in the base body.

One embodiment of the invention is characterized in that tongue-like projections which point to the inside and which are provided at a distance above the flanges on the pins of the gripping claws are located on the mountings of the gripping claws.

The tongue-like projections are used as a rest for the disk-shaped article held by the claws when the gripper according to the invention is aligned such that the claws of the base body point upward.

In one simple embodiment of the gripper according to the invention it is provided that the elastic means which load the gripping claws are coil compression springs which are placed over the guide rods and which with their one end abut the inner end of one guide sleeve and with their other end abut the surface of a guide body which points to the outside. In this way the claws are for the most part radially loaded to the inside independently of one another. But it is also possible, instead of several individual coil compression springs, to provide a ring-shaped, elastic element which for example acts around the guide body on the inner ends of the guide rods, such as a rubber band or an annular coil spring, by which likewise the claws are radially loaded to the inside.

BRIEF DESCRIPTION OF THE DRAWINGS

Other details and features of the invention arise from the following description of one embodiment of the invention in which reference is made to the attached drawings.

DETAILED DESCRIPTION OF THE PREFERRED EMBODIMENT

Figure 1:
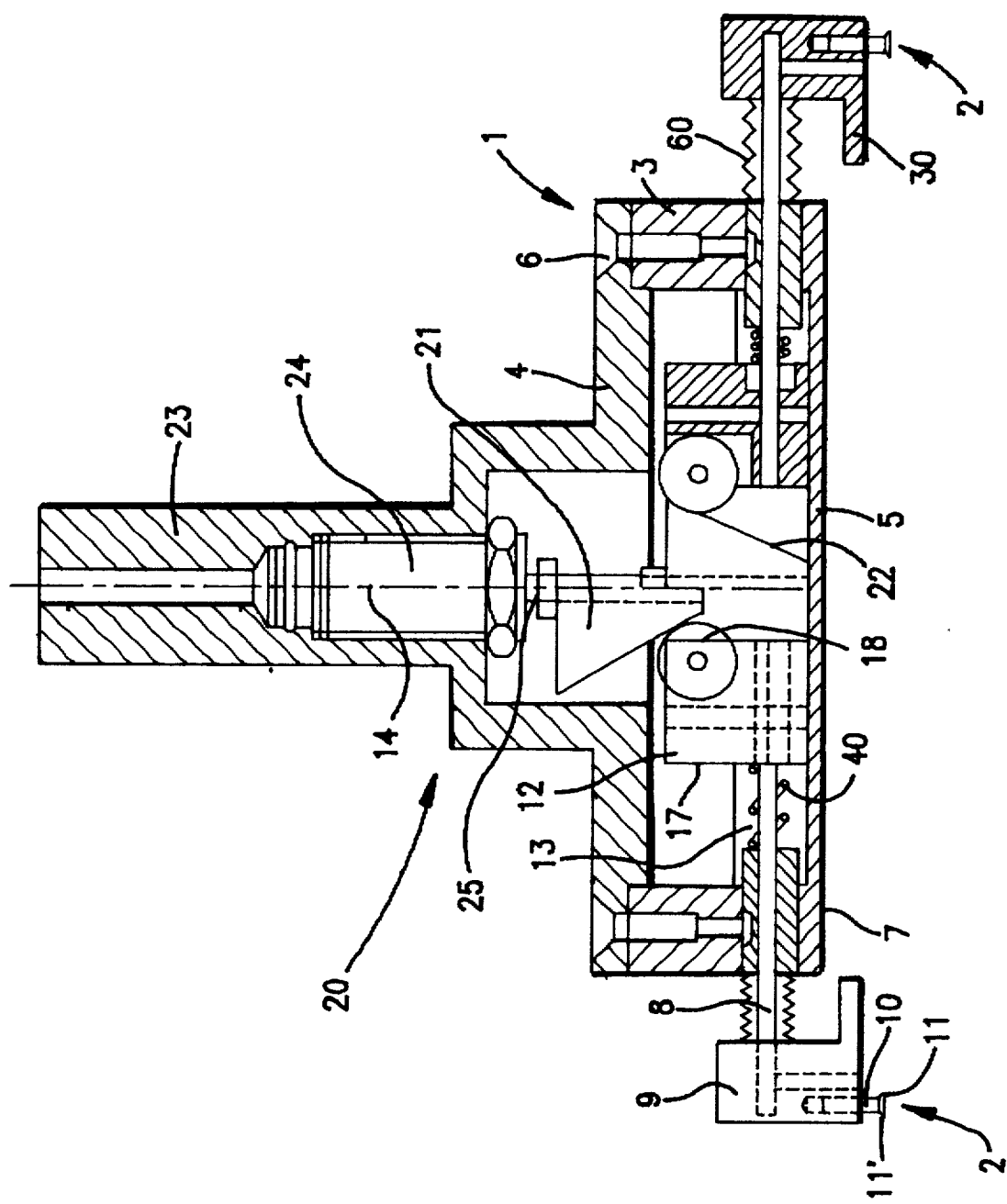
FIG. 1 shows a gripper in an axial section, in which on the left half of FIG. 1 the claws are shifted radially to the inside, conversely the claw shown in FIG. 1 on the right is pushed radially to the outside by the spreading means.
Figure 2:
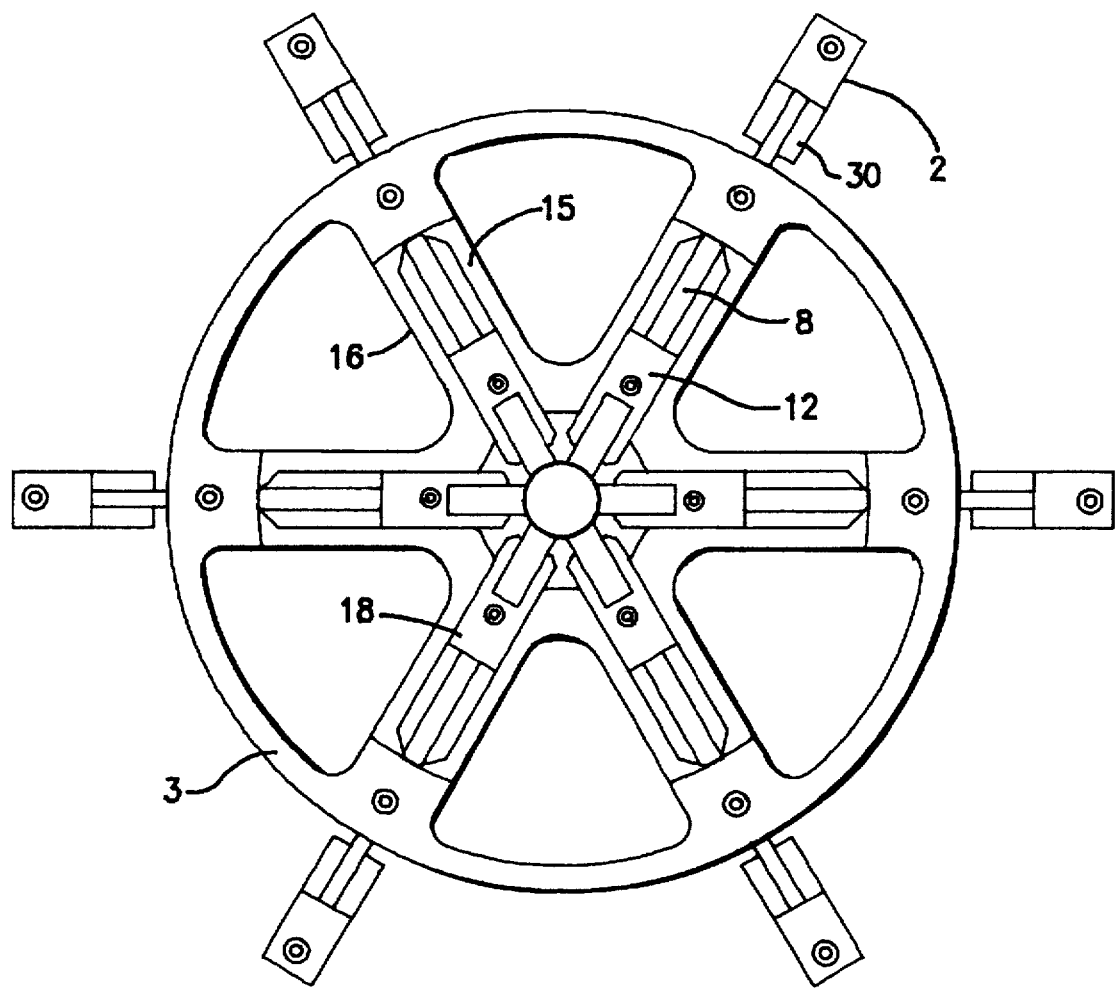
FIG. 2 shows an overhead view of the gripper according to the invention with the top removed.

The gripper according to the invention which is shown in the drawings consists of base body 1, which has a round outline in the embodiment shown, and of six gripping claws 2 which can be moved radially to the inside and outside relative to base body 1 in the embodiment shown.

Base body 1 consists of an essentially cylindrical peripheral wall 3, cover part 4, and base plate 5. These parts of base body 1 are joined to one another by screws 6. Base plate 5 can also be made in one piece with peripheral wall 3.

In wall 3 of base body 1 guide sleeves 7 are inserted in which radially aligned guide rods 8 are guided to move. In the outer ends of guide rods 8 there are retaining pieces 9 on which there are pins 10 with one radially projecting flange 11 (shoulder) each. Pins 10 are the parts of gripping claws 2 which act to grasp a disk-shaped article. The parts of guide rods 8 which lie outside wall 3 can be covered as shown in FIG. 1 by bellows 60 of variable length.

Figure 3:
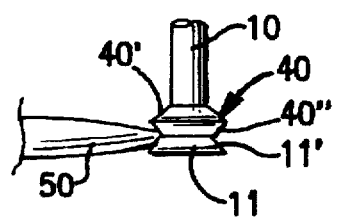
FIG. 3 shows a detail of the gripping claws in one modified embodiment.

Pins 10 can also have the execution shown in FIG. 3 with ring 40 which is bounded by two conical surfaces 40' and 40" above flange 11. In this embodiment projections 30 still to be described on retaining bodies 9 can also be omitted.

To the radially inner ends of guide rods 8 guide bodies 12 are attached which can be moved radially in guide grooves 13 with respect to axis 14. Guide grooves 13 for guide bodies 12 are formed by two walls 15, 16 which run roughly radially and which are molded to the base plate 5 of base body which is made in one piece, for example, with side wall 3, projecting to the inside.

Also included spreading means 20 in order to radially press gripping claws 2 to the outside from the readiness position shown in FIG. 1 left, into which they are pushed by compression springs 40, which may be replaced by an annular coil spring or a rubber elastic band which is placed around outside surfaces 17 of guide bodies 12.

Spreading means 20 in the embodiment shown consists of spreading body 21 with conical jacket surface 22 which acts on guide bodies 12 and thus on gripping claws 2 via rollers 18 which are supported to turn freely on guide bodies 12. To actuate spreading body 21 in a shaft-like projection of cover part 4 of base body 1 a hydraulic motor 24, preferably a pneumatic cylinder, is accommodated, with piston rod 25 which is joined to spreading body 21.

On retaining bodies 9 for pins 10 there are tongue-like projections 30 which point radially to the inside. These projections 30 are used as a rest for a disk-shaped article if base plate 5 of base body 1 points upward by turning base body 1.

If, with the gripper according to the invention, flat article 50 which lies on a horizontal surface, for example a silicon wafer, is to be held (grasped), first of all pneumatic cylinder 24 is actuated in order to press spreading body 21 downward until it abuts the inside of base plate 5, whereupon gripping claws 2 are in their radially outermost position. At this point the gripper is moved by hand or via an automatic movement device (robot) into a position in which pins 10 of gripping claws 2 are located next to the outside periphery of the article to be grasped. As soon as this has happened, spreading body 21 is moved upward so that pin 10 under the action of at least one elastic means comes into contact with the outside periphery of disk-shaped article 50. Grasping also takes place reliably when article 50 rests flat on a base since flange 11 on the free ends of gripping pins 10 have upper boundary surfaces 11' which point obliquely upward (in the shape of the jacket of a cone) so that the disk-shaped article is raised somewhat when pins 10 move inward, since it slides over oblique surface 11' upward until pins 10 adjoin the outer periphery of the article.

If the disk-shaped article, as is the case in a silicon wafer, is an article which is not perfectly round, some of gripping claws 2 will not identically abut the outside periphery of the article. If however spreading body 21 is further raised, the not yet abutting gripping claws 2 under the action of at least one spring means assigned to them move radially to the outside until they likewise abut the outside periphery of the article. Exactly centered holding of the disk-shaped article is ensured by this gradual application of gripping claws 2.

In summary the invention can be described a follows:

In order to grasp disk-shaped articles (silicon wafers), there is a gripper which has gripping claws which are guided to move radially to the inside and outside relative to a base body. Gripping claws 2 are loaded radially to the inside by spring means. In base body 1 there is spreading means 20 with conical spreading body 21 by which all gripping claws 2 can be jointly moved radially to the outside against the action of the spring means. By moving spreading means 20 back, at least some of gripping claws 2 are applied to the outside periphery of the disk-shaped article. As spreading means 20 continues to move back the remaining claws are applied to the outside periphery of the disk-shaped article under the action of the spring means assigned to it. Spreading body 21 of spreading means 20 acts on gripping claw 2 via guide bodies 12 which are provided inside the base body and which are joined to gripping claws 2 via guide rods 8.

Figure 4:
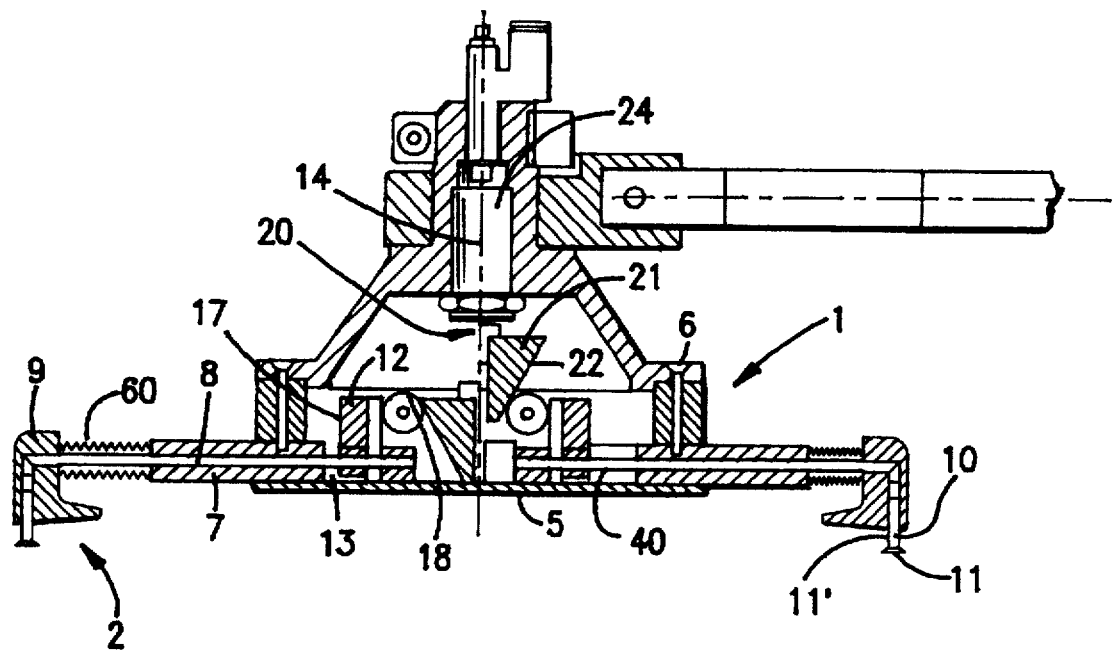
FIG. 4 shows another embodiment of the gripper in axial section.
Figure 5:
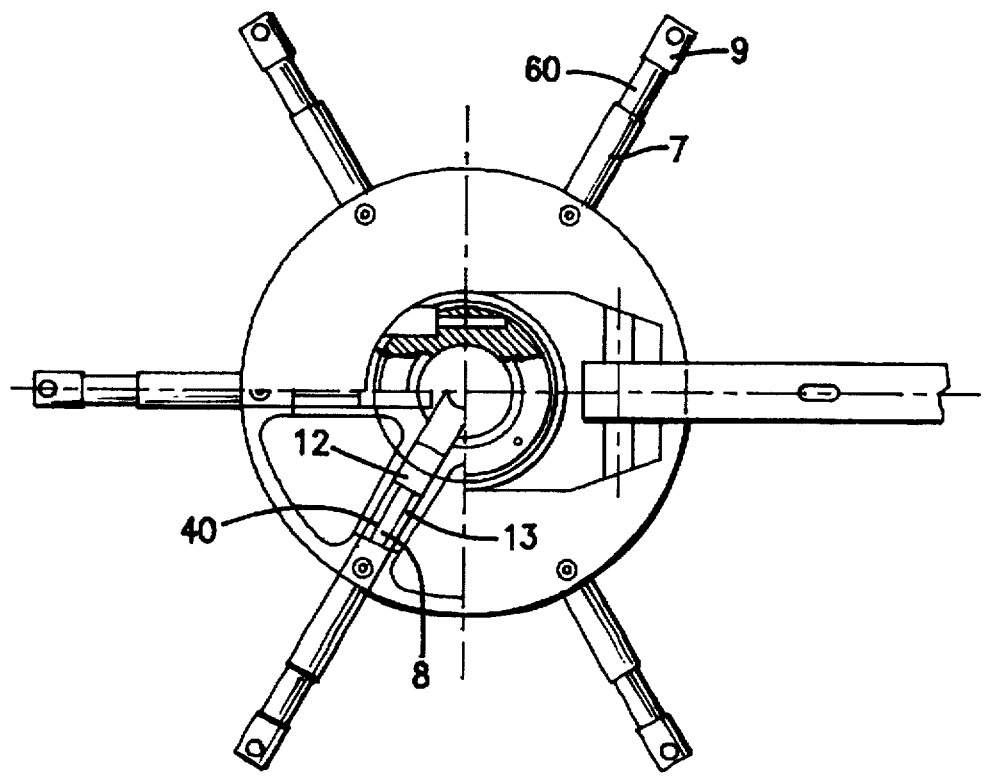
FIG. 5 shows an overhead view of another embodiment of the gripper.

One practical embodiment is shown in FIGS. 4 and 5 in two views.

I claim:

1. Gripper for disk-shaped articles having a peripheral edge that is at least approximately circular, comprising:
    a base body (1) having guide grooves (13) disposed radially thereon;
    at least three gripping claws (2) movably disposed on the base body, the gripping claws (2) being able to move radially inward and outward relative to the base body (1), the gripping claws (2) being able to abut the peripheral edge of the disk-shaped article;
    a plurality of mountings (9) to which the respective gripping claws (2) are attached;
    a plurality of guide rods (8) to which the respective mountings (9) are attached at an outer distal end of each of the guide rods (8);
    a plurality of guide sleeves (7) attached to the base body (1) such that the guide rods slidably pass through the respective guide sleeves;
    elastic means for urging the gripping claws (2) radially inward;
    a plurality of guide bodies (12) attached to inner ends of the respective guide rods (8), the guide bodies being slidably disposed within the respective guide grooves (13); and
    spreading means (20) for moving the gripping claws (2) outward against the inward urging of the elastic means, the spreading means (20) comprising a conical spreading body (21) capable of moving within the base body (1) along an axis perpendicular to directions of movement of the gripping claws (2); wherein
    the conical spreading body (21) is arranged to contact each of the plurality of guide bodies (12) such that when the conical spreading body (21) moves along its perpendicular axis so as to contact the guide bodies (12) at points of increasing radius of the conical spreading body (21), the guide bodies (12) are moved radially outward; and
    the elastic means comprises a plurality of coil compression springs each disposed around one of the guide rods (8), an inner end of each of the coil compression springs contacting an outer surface of a respective one of the guide bodies, an outer end of each of the coil compression springs contacting an inner end of a respective one of the guide sleeves (7).

2. Gripper according to claim 1, wherein portions of the guide rods (8) located outside of the base body (1) are accommodated in protective bellows (60).

3. Gripper according to claim 1, further comprising at least one pin (10) extending from each gripping claw (2), each of the pins (10) having on its free end a radially projecting flange (11) with an upper boundary surface (11') rising at a slant from an outer edge of the flange (11) to a surface of the pin (10).

4. Gripper according to claim 3, further comprising on each pin (10) a projecting ring (40) disposed between the flange (11) and the mounting (9).

5. Gripper according to claim 4, wherein ring (40) is bounded by two conical surfaces (40', 40").

6. Gripper according to claim 3, wherein on the mountings (9) of the gripping claws (2) there are tongue-like projections (30) which point to the inside and which are provided at a distance over the flanges (11) of the pins (10) of the gripping claws (2).

7. Gripper according to claim 1, wherein a conical jacket surface (22) of the spreading body (21) adjoins rollers (18) rotatable attached to the guide bodies (12).

8. Gripper according to claim 1, wherein an end position of the spreading body (21) which corresponds to a maximum outward displacement of the gripping claws (2) is determined by a front tapered end of the spreading body (21) abutting the base body (1, 5).

9. Gripper according to claim 1, wherein the spreading body (21) is actuated by a hydraulic motor (24) within the base body (1).

10. Gripper for disk-shaped articles having a peripheral edge that is at least approximately circular, comprising:
    a base body;
    a plurality of gripping claws movably disposed on the base body, the gripping claws being able to move radially inward and outward relative to the base body, the gripping claws being able to abut the peripheral edge of the disk-shaped article;
    elastic means for urging the gripping claws radially inward;
    spreading means for moving the gripping claws outward against the inward urging of the elastic means; and
    at least one pin extending from each gripping claw, each of the pins having on its free end a radially projecting flange with an upper boundary surface rising at a slant from an outer edge of the flange to a surface of the pin, each pin also having a projecting ring bounded by two conical surfaces disposed above the flange.

11. The gripper of claim 10, further comprising:
    guide grooves (13) disposed radially on the base body;
    a plurality of mountings (9) to which the respective gripping claws (2) are attached;
    a plurality of guide rods (8) to which the respective mountings (9) are attached at an outer distal end of each of the guide rods (8);

a plurality of guide sleeves (7) attached to the base body (1) such that the guide rods slidably pass through the respective guide sleeves; and a plurality of guide bodies (12) attached to inner ends of the respective guide rods (8), the guide bodies being slidably disposed within the respective guide grooves (13).

12. Gripper for disk-shaped articles having a peripheral edge that is at least approximately circular, comprising:

a base body;

a plurality of gripping claws movably disposed on the base body, the gripping claws being able to move radially inward and outward relative to the base body, the gripping claws being able to abut the peripheral edge of the disk-shaped article;

elastic means for urging the gripping claws radially inward;

spreading means for moving the gripping claws outward against the inward urging of the elastic means;

at least one pin extending from each gripping claw, each of the pins having on its free end a radially projecting flange with an upper boundary surface rising at a slant from an outer edge of the flange to a surface of the pin; and inward pointing tongue-like projections extending from the gripping claws provided at a distance over the flanges of the pins.

13. The gripper of claim 12, further comprising:

guide grooves (13) disposed radially on the base body;

a plurality of mountings (9) to which the respective gripping claws (2) are attached;

a plurality of guide rods (8) to which the respective mountings (9) are attached at an outer distal end of each of the guide rods (8);

a plurality of guide sleeves (7) attached to the base body (1) such that the guide rods slidably pass through the respective guide sleeves; and a plurality of guide bodies (12) attached to inner ends of the respective guide rods (8), the guide bodies being slidably disposed within the respective guide grooves (13).

* * * * *